United States Patent [19]
Ashley et al.

[11] Patent Number: 5,907,581
[45] Date of Patent: May 25, 1999

[54] TWO-DIMENSIONAL LOW-PASS FILTERING CODE APPARATUS AND METHOD

[75] Inventors: Jonathan James Ashley, Los Gatos; Brian Harry Marcus, Los Altos, both of Calif.

[73] Assignee: International Business Machines Corporation, Armonk, N.Y.

[21] Appl. No.: 08/722,594

[22] Filed: Sep. 27, 1996

[51] Int. Cl.[6] .................................................. H04B 14/04
[52] U.S. Cl. ......................... 375/242; 365/130; 386/33; 386/124
[58] Field of Search .................................. 375/240, 241, 375/242, 261, 262, 298; 369/59, 116; 365/130, 189.01, 189.04, 216; 386/111, 112, 33, 36, 123, 124

[56] References Cited

U.S. PATENT DOCUMENTS

| | | | |
|---|---|---|---|
| 4,489,418 | 12/1984 | Mazo | 375/27 |
| 4,755,998 | 7/1988 | Gallager | 371/30 |
| 4,941,154 | 7/1990 | Wei | 375/39 |
| 4,959,842 | 9/1990 | Forney, Jr. | 375/39 |
| 5,105,442 | 4/1992 | Wei | 375/39 |
| 5,159,610 | 10/1992 | Eyuboglu et al. | 375/18 |
| 5,168,509 | 12/1992 | Nakamura et al. | 375/39 |
| 5,175,631 | 12/1992 | Juri et al. | 386/33 |
| 5,233,629 | 8/1993 | Paik et al. | 375/39 |
| 5,418,798 | 5/1995 | Wei | 371/43 |
| 5,448,592 | 9/1995 | Williams et al. | 375/263 |
| 5,491,678 | 2/1996 | Maeda et al. | 369/59 |
| 5,537,382 | 7/1996 | McLaughlin et al. | 369/116 |
| 5,604,824 | 2/1997 | Chui et al. | 382/248 |

*Primary Examiner*—Jason Chan
*Assistant Examiner*—Congvan Tran
*Attorney, Agent, or Firm*—Morgan & Finnegan LLP

[57] ABSTRACT

A one-dimensional data stream is encoded into a two-dimensional data array with reduced high frequency components, for recording on a two-dimensional recording device, such as a holographic storage device. A two-dimensional data array read from the two-dimensional recording device is decoded into the original one-dimensional data stream. To encode, a one-dimensional data stream is partitioned into a plurality of chunks of data. Each chunk of data is partitioned into a plurality of groups of bits. Each group of bits is encoded into a two dimensional data array according to a predefined constraint. A plurality of two-dimensional data arrays are concatenated into a data strip. A plurality of data strips are then assembled into a complete two-dimensional data block. To decode, a two-dimensional data stream is partitioned into multiple small two-dimensional arrays. Each array is decoded into a multi-bit group. In one embodiment, this decoding is a function of other nearby groups. Multi-bit groups are assembled to form a long chunk. Long chunks are assembled to form a one-dimensional data stream.

48 Claims, 7 Drawing Sheets

401
Constraint 1
Forbidden Encodings $$\begin{array}{c} 111 \\ 101 \\ 111 \end{array} \quad \begin{array}{c} 000 \\ 010 \\ 000 \end{array}$$

FIG. 4a

402
Constraint 2
Forbidden Encodings $$\begin{array}{c} 1 \\ 101 \\ 1 \end{array} \quad \begin{array}{c} 0 \\ 010 \\ 0 \end{array}$$

FIG. 4b

403
Constraint 3
Forbidden Encodings $$\begin{array}{c} 1 \\ 101 \\ 1 \end{array} \quad \begin{array}{c} 0 \\ 010 \\ 0 \end{array}$$

$$\begin{array}{c} 0 \\ 101 \\ 1 \end{array} \quad \begin{array}{c} 1 \\ 010 \\ 0 \end{array}$$

$$\begin{array}{c} 1 \\ 100 \\ 1 \end{array} \quad \begin{array}{c} 0 \\ 011 \\ 0 \end{array}$$

$$\begin{array}{c} 1 \\ 101 \\ 0 \end{array} \quad \begin{array}{c} 0 \\ 010 \\ 1 \end{array}$$

$$\begin{array}{c} 1 \\ 001 \\ 1 \end{array} \quad \begin{array}{c} 0 \\ 110 \\ 0 \end{array}$$

FIG. 4c

404
Constraint 4
Forbidden Encodings $$101 \quad 010$$

$$\begin{array}{c} 1 \\ 0 \\ 1 \end{array} \quad \begin{array}{c} 0 \\ 1 \\ 0 \end{array}$$

FIG. 4d

405
Constraint 5
Forbidden Encodings

| 101 | 010 |

| 1<br>0<br>1 | 0<br>1<br>0 |

| 001<br>100<br>110 | 110<br>011<br>001 |

| 110<br>100<br>001 | 001<br>011<br>110 |

| 011<br>001<br>100 | 100<br>110<br>011 |

| 100<br>001<br>011 | 011<br>110<br>100 |

FIG. 4e

TWO-DIMENSIONAL LOW-PASS FILTERING CODE APPARATUS AND METHOD

FIELD OF THE INVENTION

The present invention relates to the encoding of digital data, particularly the encoding of digital data so as to low-pass filter the data for recording of two-dimensional arrays.

BACKGROUND OF THE INVENTION

Mass data storage devices have always been essential to computer technology. The disk drive is one familiar mass storage device. Although the surface of the disk is two-dimensional, the data is stored in one-dimensional tracks on the disk. This results in a one-dimensional data stream, or bit stream, as shown in FIG. 1a. Data bits, indexed as n−2, n−1, n, n+1, n+2, etc., are arranged in successive positions on the track. This is a one-dimensional array, which may either be represented linearly, as shown in FIG. 1a (rectangular coordinates), or may be understood as being arranged around the perimeter of a circular track (polar coordinates). In either case, the bits are arranged one-dimensionally. (Note that that the legend "n Dimension" in FIG. 1a refers not to n distinct dimensions, but rather to the single dimension, along whose length the bits, indexed as stated, are deployed.)

Each bit in the data stream is adjacent to only two bits, its immediate neighbors in the positive and negative directions in one dimension. As recording density increases, high frequency components in the recorded signal increase. Due to bandwidth limitations, those increased high frequency components may not be faithfully reproduced. This causes "smearing" of the data bits. This smearing manifests itself as interaction and distortion between adjacent bits in the data stream. In a one-dimensional data stream, such interaction and distortion can only occur in one dimension.

There are also mass storage devices which utilize two-dimensional recording technology, such as holographic storage. The data in such a device is not stored in one-dimensional tracks, but rather is stored in the form of two dimensional arrays, as shown in FIG. 1b. Each bit is adjacent to as many as eight other bits, its immediate neighbors in the eight combinations of the positive and negative directions in two dimensions x and y, including diagonally adjacent bits. Interaction and distortion may occur between all adjacent bits in both dimensions.

One approach to dealing with data interaction and distortion is to encode the recorded data so as to reduce the high frequency components which must be reproduced. In essence, encoding the data low-pass filters the data before it is recorded. Although low-pass filtering encoding schemes have been developed for one-dimensional data streams, these schemes are not generally applicable to two-dimensional recording. In two-dimensional recording, the high frequency components must be reduced in both dimensions.

SUMMARY OF THE INVENTION

The present invention is a method and apparatus for encoding a one-dimensional data stream into a two-dimensional data array with reduced high frequency components, and decoding the two-dimensional data array into the original one-dimensional data stream. The two-dimensional data array is useful as input to a storage device, such as, for example, a holographic recording system. Encoding in accordance with the present invention ensures that the two-dimensional data array has reduced high frequency components. This reduces interaction and distortion of the data bits, providing improved error rate and recording density performance of the storage device, as well as reduced cost.

This is particularly useful for holographic storage systems which use one-to-one pixel mapping between the input and output mechanisms, as well as for those systems that employ a phase mask.

In accordance with the encoding aspect of the present invention, a one-dimensional data stream is partitioned into a plurality of chunks of data. Each chunk of data is partitioned into a plurality of groups of bits. Each group of bits is encoded into a two dimensional data array according to a predefined constraint. In one embodiment, this encoding is a function of other nearby groups. A plurality of two-dimensional data arrays are concatenated into a data strip. A plurality of data strips are then assembled into a complete two-dimensional data block, which still satisfies the given constraint.

In accordance with the decoding aspect of the present invention, a two-dimensional data stream is partitioned into a plurality of small two-dimensional arrays. Each array is decoded into a multi-bit group. In one embodiment, this decoding is a function of other nearby groups. A plurality of multi-bit groups are assembled to form a long chunk. A plurality of chunks are assembled to form a one-dimensional data stream.

BRIEF DESCRIPTION OF THE DRAWINGS

The details of the present invention, both as to its structure and its operation, can best be understood by referring to the accompanying drawings, in which like reference numbers and designations refer to like elements.

FIG. 4a is a schematic diagram of an encoding constraint, in accordance with one embodiment of the present invention.

FIG. 4b is a schematic diagram of an encoding constraint, in accordance with another embodiment of the present invention.

FIG. 4c is a schematic diagram of an encoding constraint, in accordance with another embodiment of the present invention.

FIG. 4d is a schematic diagram of an encoding constraint, in accordance with another embodiment of the present invention.

FIG. 4e is a schematic diagram of an encoding constraint, in accordance with another embodiment of the present invention.

DETAILED DESCRIPTION OF THE INVENTION

The present invention encodes a one-dimensional stream of data into two-dimensional arrays of data, for recording on a storage device which accepts input in the form of two-dimensional arrays. Furthermore, each group of . one-dimensional data is mapped to a two-dimensional array of data. This differs from encoding schemes in which one-dimensional data is mapped to one or more points in a constellation of points defined in an imaginary "two-dimensional" space. The dimensions of this imaginary "two-dimensional" space typically represent electrical parameters of the encoded signal, such as amplitude and phase.

Figure 1A:
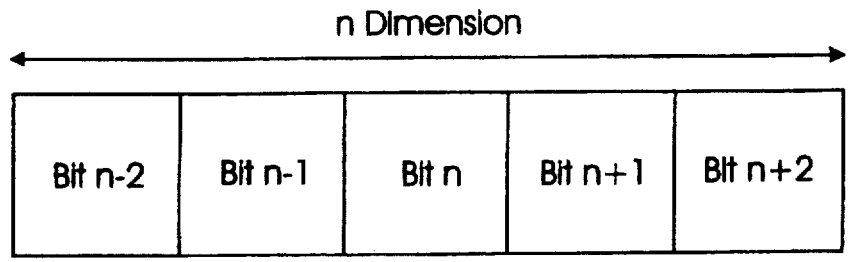
FIG. 1a is a block diagram of one-dimensional data recording.
Figure 1B:
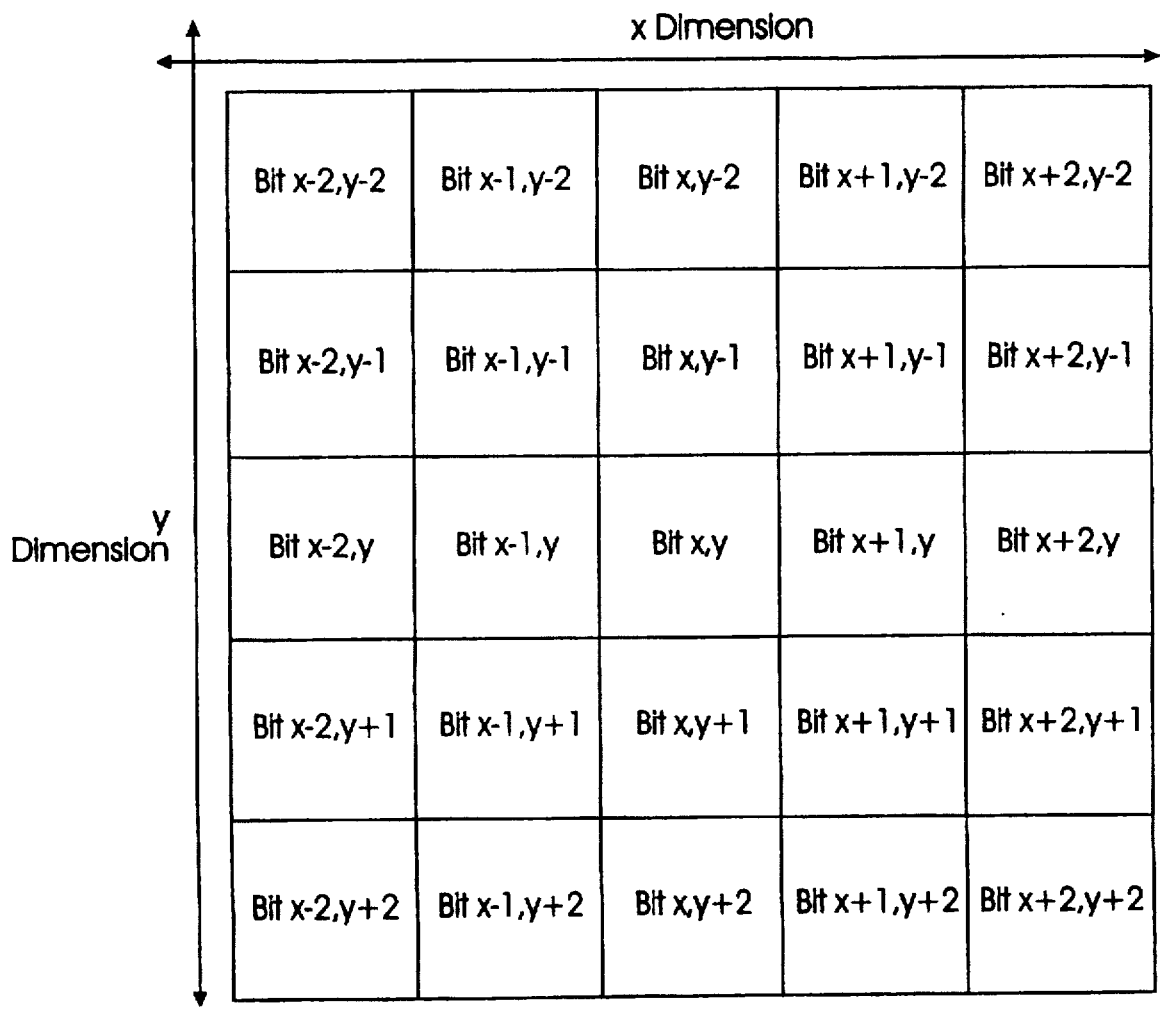
FIG. 1b is a block diagram of two-dimensional data recording.
Figure 2A:
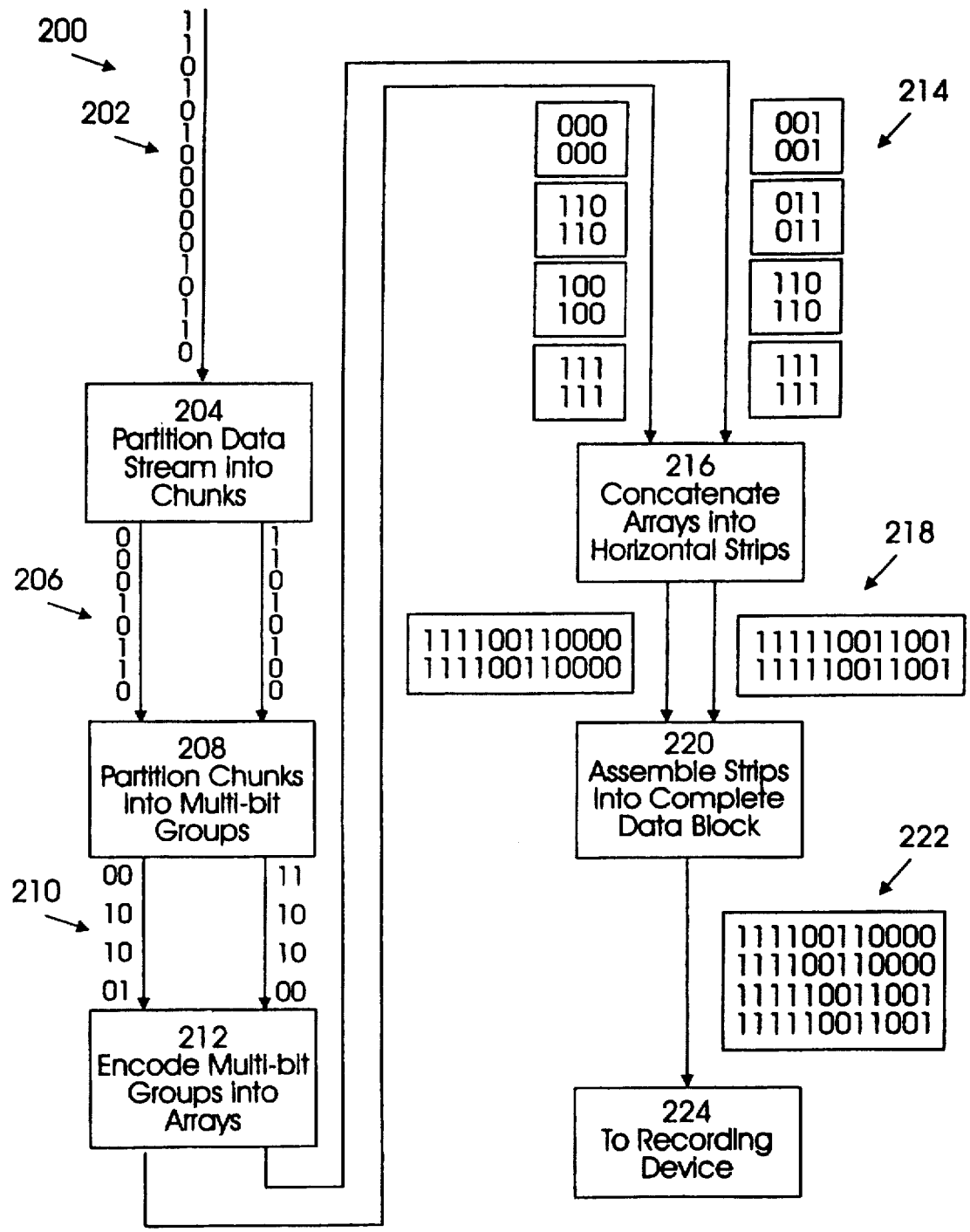
FIG. 2a is a flow diagram of an encoding process 200, in accordance with the present invention.

The major steps of encoding data in accordance with the present invention are shown in a flow diagram of encoding process 200 in FIG. 2a. As shown in FIG. 2a, data stream 202 is processed to produce two-dimensional data block 222. In the example shown in FIG. 2a, the input data stream is "1101010000010110". Step 204 is a first partitioning step, in which data stream 202 is partitioned into a plurality of long chunks 206. Each chunk 206 is a one-dimensional data stream comprising a unique portion of data stream 202. For example, the data stream "1101010000010110" is simply divided at its middle into two chunks, "11010100" and "00010110".

Step 208 is a second partitioning step, in which each chunk 206 is partitioned into a plurality of multi-bit groups 210 of identical length. Each multi-bit group 210 is a one-dimensional data stream comprising a unique portion of a chunk 206. In the example, the chunk "11010100" is partitioned into the multi-bit groups "11", "10", "10" and "00" and the chunk "00010110" is partitioned into the multi-bit groups "00", "10", "10" and "01". While the bit order of the multi-bit groups of the present example is reversed from the order in which the bits appeared in the chunk, this reversal need not be the case.

In step 212, each multi-bit group 210 is encoded to form a small two-dimensional array of data 214. The encoding in step 210 is carried out in accordance with one or more constraints, which are described in detail below. In the example, the multi-bit groups are encoded in accordance with the encoding termed Constraint 5, which is described below. This encoding transforms a two-bit input group into a 2 by 3 output array. The specific encoding of the input two-bit group varies depending on the surrounding two-bit groups. Thus, identical two-bit groups may be encoded to different 2 by 3 bit arrays, depending on the surrounding two-bit groups. In the example, the encoding is as follows:

| 00 | → | 000 | 11 | → | 001 |
|----|---|-----|----|----|-----|
|    |   | 000 |    |   | 001 |
| 10 | → | 110 | 10 | → | 011 |
|    |   | 110 |    |   | 011 |
| 10 | → | 100 | 10 | → | 110 |
|    |   | 100 |    |   | 110 |
| 01 | → | 111 | 00 | → | 111 |
|    |   | 111 |    |   | 111 |

In step 216, a plurality of data arrays 214 are concatenated to form a long two-dimensional horizontal strip 218. In the example, the data arrays are concatenated as follows:

111 + 100 + 110 + 000 → 111100110000

-continued 111   100   110   000   111100110000 and

| 111 | + | 110 | + | 011 | + | 001 | → | 111110011001 |
|-----|---|-----|---|-----|---|-----|---|--------------|
| 111 |   | 110 |   | 011 |   | 001 |   | 111110011001 |

In step 220, a plurality of strips 218 are stacked vertically to form a complete two-dimensional data block 222. In the example, the horizontal strips are assembled as follows:

111100110000
111100110000
+              →    111100110000
111110011001        111100110000
111110011001        111110011001
                    111110011001

In step 224, block 222 is sent to a recording device for recording in two-dimensional form.

Figure 2B:
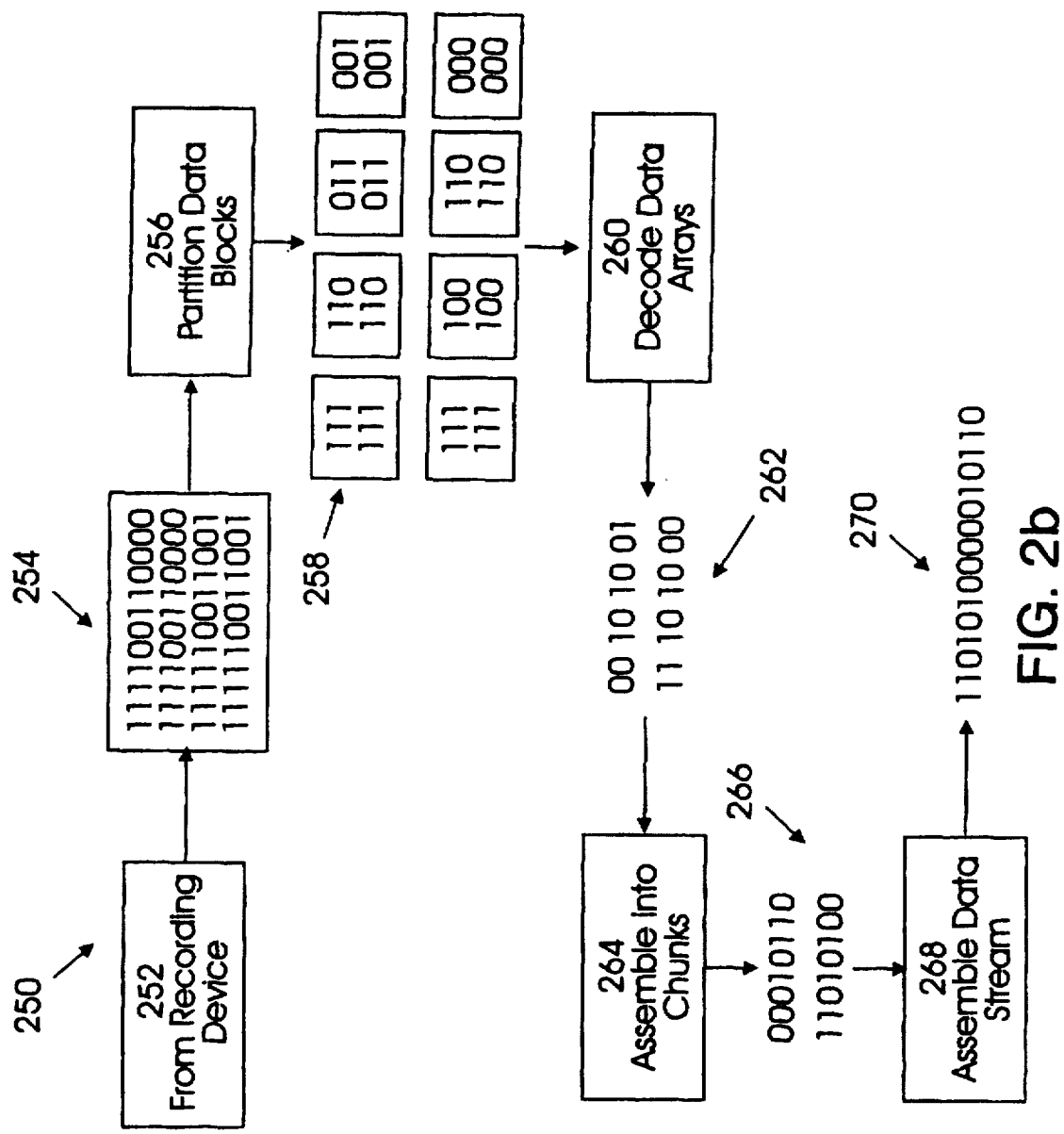
FIG. 2b is a block diagram of a decoding process 250, in accordance with the present invention.

The major steps of decoding data in accordance with the present invention are shown in a flow diagram of decoding process 250 in FIG. 2b. In step 252, two-dimensional data block 254 is read from a two-dimensional recording device. In the example shown in FIG. 2b, the data block is:
111100110000
111100110000
111110011001
111110011001

In step 256, data block 254 is partitioned to form multiple two-dimensional arrays of data 258. In the example, the partitioning is as follows:

|              | 111 | 100 | 110 | 000 |
|--------------|-----|-----|-----|-----|
| 111100110000 | 111 | 100 | 110 | 000 |
| 111100110000 |     |     |     |     |
| 111110011001 | →   |     |     |     |
| 111110011001 | 111 | 110 | 011 | 001 |
|              | 111 | 110 | 011 | 001 |

In step 260, each data array 258 is decoded to recover multi-bit groups 262. In the example, the data arrays are decoded as follows:

| 000 | → | 00 | 001 | → | 11 |
|-----|---|----|-----|---|----|
| 000 |   |    | 001 |   |    |

| 110 | → | 10 | 011 | → | 10 |
|-----|---|----|-----|---|----|
| 110 |   |    | 011 |   |    |

| 100 | → | 10 | 110 | → | 10 |
|-----|---|----|-----|---|----|
| 100 |   |    | 110 |   |    |

| 111 | → | 01 | 111 | → | 00 |
|-----|---|----|-----|---|----|
| 111 |   |    | 111 |   |    |

In step 264, multiple bit groups 262 are assembled to form long chunks of data 266. In the example, the multi-bit groups "11", "10", "10" and "00" are assembled to form the chunk "11101000" and the multi-bit groups "00", "10", "10" and "01" are assembled to form the chunk "00101001". In step 268, long chunks 266 are concatenated to form a one-dimensional data stream 270. Thus, in the example shown in FIG. 2b, the chunks "11101000" and "00101001" are concatenated to form the one-dimensional data stream "1110100000101001".

Figure 3A:
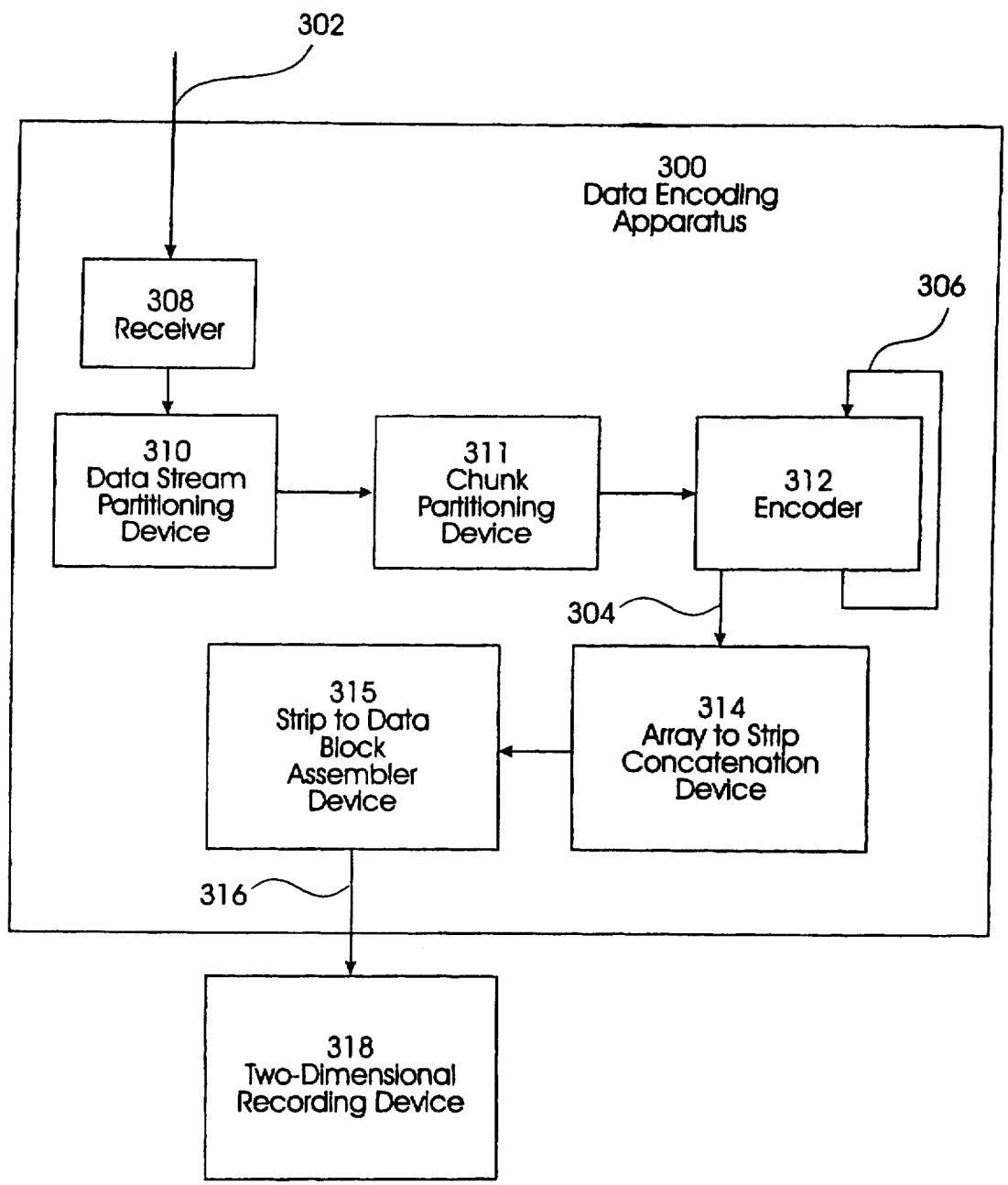
FIG. 3a is a block diagram of an encoder 300, in accordance with the present invention.

A block diagram of a data encoding apparatus 300, which performs encoding process 200 of FIG. 2a, is shown in FIG. 3a. Encoding apparatus 300 operates at each time slot, encoding each multi-bit group into a two-dimensional data array.

Encoding apparatus 300 includes a receiver 308, which accepts the data bit stream to be encoded from input 302. Data stream partitioning device 310 accepts the bit stream from receiver 308 and partitions the bit stream first into long chunks. Chunk partitioning device 311 accepts the long chunks from data stream partitioning device 310 and partitions each chunk into multi-bit groups. Encoder 312 accepts the multi-bit groups and encodes them into two-dimensional data arrays which are then output on output 304. Array-to-strip concatenation device 314 accepts the two-dimensional data arrays and concatenates them into long horizontal strips. Strip-to-data block assembler device 315 accepts the long horizontal strips and assembles them into two-dimensional data blocks of the size and shape required by two-dimensional recording device 318. The data sets are transferred to storage device 318 over data path 316.

Encoder 312 is preferably implemented as a finite state machine which also includes feedback path 306, over which the current state of the finite state machine is fedback to the input to the finite state machine. The encoder will preferably operate in parallel on multi-bit data groups from several chunks simultaneously. Encoding apparatus 300, or portions thereof, may also be implemented using a programmed computer system, microcomputer, or the equivalent. However, for applications involving high data throughput, discrete implementations, such as a finite state machine, do have a performance advantage.

The encoder begins at a specified initial state. Both the encoded output array and the new state are functions of the current state and the current input bits. The encoder generates a long horizontal strip from a long chunk of data bits, partitioned into non overlapping groups, by concatenating successively encoded two-dimensional arrays. A large data block is assembled from a long sequence of data bits, by dividing the sequence into several chunks.

Figure 3B:
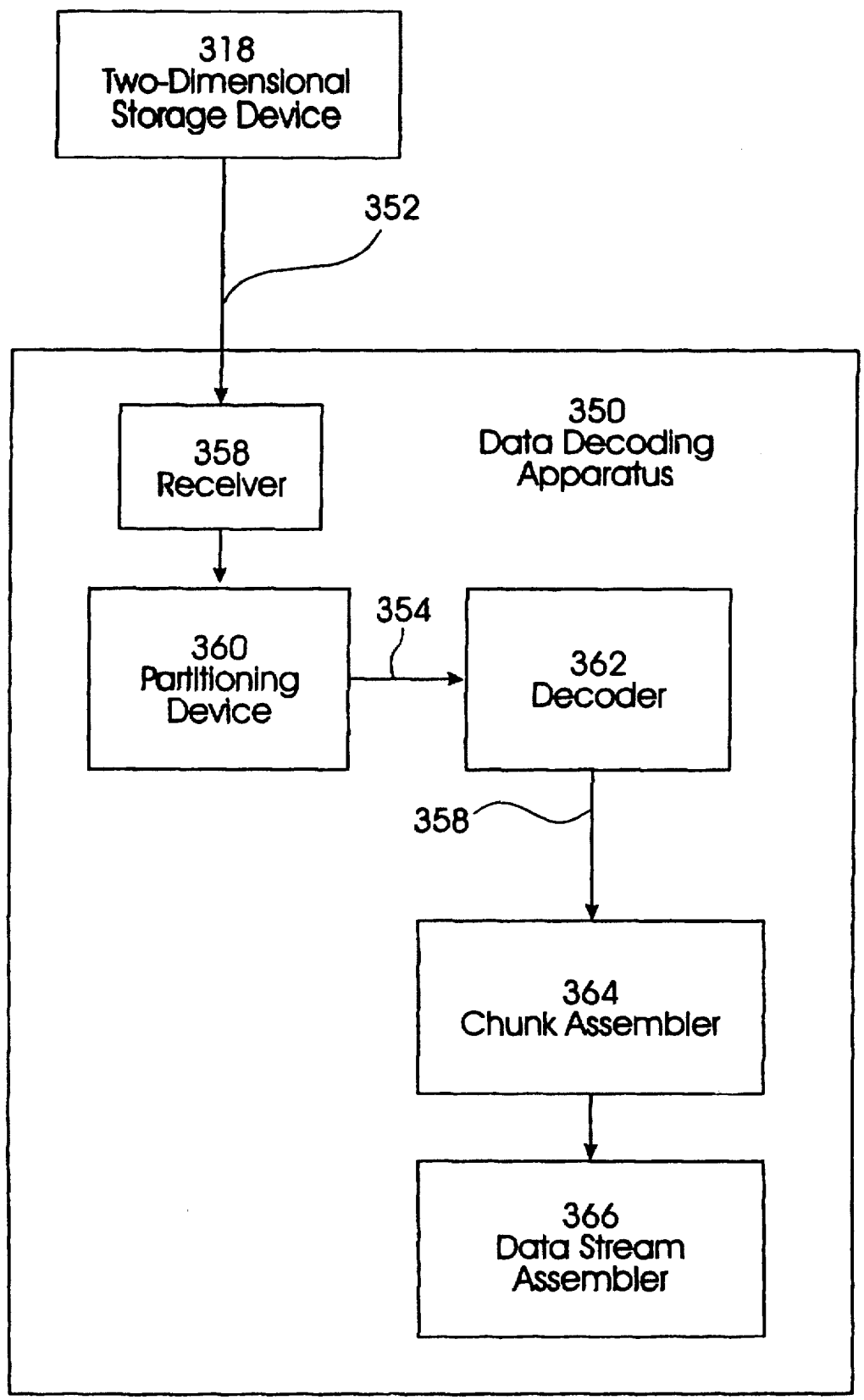
FIG. 3b is a block diagram of a decoder, 350, in accordance with the present invention.

A block diagram of data decoding apparatus 350, which performs decoding process 250 of FIG. 2b, is shown in FIG. 3b. Decoding apparatus 350 includes a receiver 358, which accepts the data block to be decoded from two-dimensional recording device 318 over input 352. Partitioning device 360 accepts the data set from receiver 358 and partitions it into two-dimensional data arrays. Decoder 362 accepts the data arrays on input 354 and outputs the decoded multi-bit groups on output 358. Chunk assembler 364 accepts the decoded multi-bit groups and assembles them into long chunks. Data stream assembler 366 accepts the long chunks and assembles them into the output data stream.

Depending upon the particular decoding being performed, decoder 362 is preferably implemented either as a finite state machine or as a look-up table using a logic device such as a RAM, ROM, PAL or other equivalent logic device. Decoding apparatus 350, or portions thereof, may also be implemented using a programmed computer system, microcomputer, or the equivalent. However, for applications involving high data throughput, discrete implementations, such as a logic device look-up table, do have a performance advantage.

In coding for low-pass filtering, each group of input data is transformed into a different group of output data. A very simple approach to this is to simply oversample the data. For example, a 0 may be represented by a 2-by-2 square of 0's and a 1 may be represented by a 2-by-2 square of 1's. Then the sequence "0100" would be represented by the 2-by-8 strip:

00110000
00110000

The sequence "01001 10110110110" may be divided into four chunks, each of which is represented by a 2-by-8 strip. The strips may then be stacked vertically to form an 8-by-8 block:

00110000
00110000
11110011
11110011
11001111
11001111
00111100
00111100

Intuitively, oversampling makes the features of the data "fatter." This allows the data to survive a limited amount of smearing. An encoder which performs this transformation outputs four bits of data for each bit of data input. Such an encoder is termed to have an encoder rate of 1:4. In a holographic recording application, this means that 4 data pixels are needed to represent a single bit of information, thus reducing the data density by a factor of 4.

At a given error rate, the data density of simple oversampling can be improved upon by more complex encoding techniques. In the present invention, long chunks of arbitrary data are encoded to form long strips of constrained data which are stacked vertically to form complete data blocks. The complete data blocks are guaranteed to satisfy constraints which enforce the low-pass filtering effect, while at the same time improving data density.

The present invention comprises a plurality of specific encoding techniques, which are distinguished by the constraints used during the encoding step. The embodiments are described in terms of constraints which enforce the low-pass filtering effect. Each constraint is defined by a list of forbidden patterns. This means that a complete two-dimensional data block satisfies the constraint if and only if it does not contain any forbidden patterns.

One embodiment, termed constraint 1, uses the constraint that no 0 can be completely surrounded by 1's and that no 1 can be completely surrounded by 0's. The forbidden encodings 401 under this constraint are shown in FIG. 4a.

Another embodiment, termed constraint 2, uses the constraint that the four nearest neighbors to a 0 not be all 1's and that the four nearest neighbors to a 1 not be all 0's. The forbidden encodings 402 under this constraint are shown in FIG. 4b.

Another embodiment, termed constraint 3, uses the constraint that three of the four nearest neighbors to a 0 not be all 1's and that three of the four nearest neighbors to a 1 not be all 0's. The forbidden encodings 403 under this constraint are shown in FIG. 4c.

Another embodiment, termed constraint 4, uses the constraint that no 0 or 1 be isolated either horizontally or vertically. The forbidden encodings 404 under this constraint are shown in FIG. 4d.

Another embodiment, termed constraint 5, uses the constraint that every 0 belongs to a 2-by-2 square of 0's and every 1 belongs to a 2-by-2 square of 1's. The forbidden encodings 405 under this constraint are shown in FIG. 4e.

There are several considerations when selecting a particular encoding and which constraint is to be used. Among these are the extent to which low-pass filtering is achieved, the size and shape of the encoded array, the rate of the encoder, the complexity of the encoder, and the distance a bit error will propagate. Constraint 2, with an encoded array size of 2-by-2 bits, provides a good combination of these factors. It is for this reason that this embodiment is preferred. Constraint 5, with an encoded array size of 2-by-3 bits, also provides an acceptable combination of factors.

Table 1 describes the operation of an encoder in accordance with constraint 5, for which the forbidden encodings are shown in FIG. 4e, and an encoded array size of 2-by-3 bits. This encoder has a rate of 1:3. The columns are indexed by the 2-bit data input, the rows are indexed by the states ($\{1, 2, 3, 4\}$). For each state, the output and the next state is determined by two bit data input.

TABLE 1

| | Input | | | | | | | |
|---|---|---|---|---|---|---|---|---|
| | 00 | | 01 | | 10 | | 11 | |
| State | Output | Next State | Output | Next State | Output | Next State | Output | Next State |
| 1 | 111 111 | 3 | 111 111 | 4 | 110 110 | 2 | 001 001 | 4 |
| 2 | 000 000 | 1 | 000 000 | 2 | 011 011 | 3 | 001 011 | 4 |
| 3 | 000 000 | 1 | 000 000 | 2 | 110 110 | 2 | 001 001 | 4 |
| 4 | 111 111 | 3 | 111 111 | 4 | 100 100 | 1 | 100 100 | 2 |

A long chunk of data bits is encoded into a long horizontal strip of height 2. Each sequence is begun at a preselected state. The selection of state is arbitrary, but some initial state must be selected. Preferably, the circuitry or software, which implements the encoder, is designed to automatically select an initial state.

For example, the data sequence "0110100000101011" is partitioned into two chunks "0110100" and "00101011". The first chunk drives the encoder through the state sequence:

$1^{01} \rightarrow 4^{10} \rightarrow 1^{10} \rightarrow 2^{00} \rightarrow 1$

The output strip is:

111100110000

111100110000

The second chunk drives the encoder through the state sequence:

$1^{00} \rightarrow 3^{10} \rightarrow 2^{10} \rightarrow 3^{11} \rightarrow$

The output strip is:

111110011001

111110011001

The two strips are then stacked to form the complete two-dimensional data block:

111100110000

111100110000

111110011001

111110011001

Table 2 describes the operation of a decoder for the encoding of table 1. Situations which cannot occur are indicated by "x".

TABLE 2

| Array being Decoded | Subsequent Array | | | | | |
|---|---|---|---|---|---|---|
| | 000 | 001 | 110 | 111 | 100 | 011 |
| 000 000 | 01 | 00 | 00 | 00 | x | 01 |
| 001 001 | x | x | x | 11 | 11 | x |
| 110 110 | 10 | x | x | x | x | 10 |
| 111 111 | 00 | 00 | 00 | 01 | 01 | x |
| 100 100 | 11 | 10 | 10 | 10 | x | 11 |
| 011 011 | 10 | 10 | 10 | 11 | 11 | x |

Table 3 describes the operation of an encoder in accordance with constraint 2, for which the forbidden encodings are shown in FIG. 4b, and an encoded array size of 2-by-2 bits. This encoder has a rate of 3:4. The columns are indexed by the 3-bit data input, the rows are indexed by the states ($\{1, 2, 3, 4\}$). For each state, the output (O) and the next state (N) is determined by three bit data input.

TABLE 3

| | Input | | | | | | | | | | | | | | | |
|---|---|---|---|---|---|---|---|---|---|---|---|---|---|---|---|---|
| | 000 | | 001 | | 010 | | 011 | | 100 | | 101 | | 110 | | 111 | |
| State | O | N | O | N | O | N | O | N | O | N | O | N | O | N | O | N |
| 1 | 00 00 | 1 | 10 10 | 1 | 01 01 | 2 | 11 11 | 2 | 11 01 | 2 | 01 11 | 2 | 00 11 | 3 | 11 00 | 4 |
| 2 | 00 00 | 1 | 10 10 | 1 | 01 01 | 2 | 11 11 | 2 | 00 10 | 1 | 10 00 | 1 | 00 11 | 3 | 11 00 | 4 |
| 3 | 00 00 | 1 | 10 10 | 1 | 01 01 | 2 | 11 11 | 2 | 00 10 | 1 | 01 11 | 2 | 00 11 | 3 | 00 00 | 4 |
| 4 | 00 00 | 1 | 10 10 | 1 | 01 01 | 2 | 11 11 | 2 | 11 01 | 2 | 10 00 | 1 | 00 11 | 3 | 11 00 | 4 |

A long sequence of data bits is encoded into a long horizontal array of height 2. Each sequence is begun at a preselected state. The selection of state is arbitrary, but some initial state must be selected. Preferably, the circuitry or software, which implements the encoder, is designed to automatically select an initial state.

$$1^{110} \rightarrow 3^{101} \rightarrow 2^{000} \rightarrow 1^{111} \rightarrow 4^{100} \rightarrow 2$$

For example, the data sequence "110101000111100" drives the encoder through the state sequence:
The output array is:
0001001111
1111000001

Table 4 describes the operation of a decoder for the encoding of table 3.

TABLE 4

| Array being decoded | | | | | | | | | |
|---|---|---|---|---|---|---|---|---|---|
| 00 | 10 | 01 | 11 | 00 | 11 | 10 | 01 | 00 | 11 |
| 00 | 10 | 01 | 11 | 10 | 01 | 00 | 11 | 11 | 00 |
| 000 | 001 | 010 | 001 | 100 | 100 | 101 | 101 | 110 | 111 |

Encoding in accordance with any of the embodiments described above ensures that the two-dimensional data array has reduced high frequency components, which reduces interaction and distortion of the data bits. This provides improved error rate and recording density performance of the storage device, as well as reduced cost.

A number of embodiments of the present invention have been described. Nevertheless, one of skill in the art will understand that various modifications may be made without departing from the scope and spirit of the invention. For example, constraints other than those described may be used for encoding data groups. Likewise, the data stream may be partitioned differently, depending on implementation considerations. Accordingly, it is to be understood that the invention is not to be limited by the specific embodiments illustrated, but rather only by the scope of the appended claims.

What is claimed is:

1. An apparatus for encoding a one-dimensional data stream into a two-dimensional data block for recording on a two-dimensional recording device, comprising:

a receiver, receiving a data stream;

a partitioning device, coupled to the receiver, partitioning the received data stream into a plurality of groups of bits;

an encoder, coupled to the partitioning device, encoding each group of bits into a two dimensional data array according to a predefined constraint, wherein the predefined constraint enforces low-pass filtering; and a data block assembly device, coupled to the encoder, assembling a plurality of two-dimensional data arrays into a two-dimensional data block.

2. The apparatus of claim 1, wherein the partitioning device comprises:

a first partitioning unit, coupled to the receiver, partitioning the received data stream into a plurality of chunks of data; and a second partitioning unit, coupled to the first partitioning unit, partitioning each chunk of data into a plurality of groups of bits.

3. The apparatus of claim 1, wherein the data block assembly device comprises:

a concatenation device, coupled to the encoder, concatenating a plurality of two-dimensional data arrays into a data strip; and an assembler device, coupled to the concatenation device, assembling a plurality of data strips into a two-dimensional data block.

4. The apparatus of claim 1, wherein:

the partitioning device comprises:

a first partitioning unit, coupled to the receiver, partitioning the received data stream into a plurality of chunks of data, and a second partitioning unit, coupled to the first partitioning unit, partitioning each chunk of data into a plurality of groups of bits; and the data block assembly device comprises:

a concatenation device, coupled to the encoder, concatenating a plurality of two-dimensional data arrays into a data strip, and an assembler device, coupled to the concatenation device, assembling a plurality of data strips into a two-dimensional data block.

5. The apparatus of claim 1, wherein the predefined constraint is that no 0 is completely surrounded by 1's and that no 1 is completely surrounded by 0's.

6. The apparatus of claim 1, wherein the predefined constraint is that fewer than four of the nearest neighbors to a 0 are 1's and that fewer than four of the nearest neighbors to a 1 are 0's.

7. The apparatus of claim 6, wherein the group of bits is three bits in length.

8. The apparatus of claim 7, wherein the two-dimensional array is two bits high and two bits long.

9. The apparatus of claim 1, wherein the predefined constraint is that fewer than three of the four nearest neighbors to a 0 are all 1's and that fewer than three of the four nearest neighbors to a 1 are all 0's.

10. The apparatus of claim 1, wherein the predefined constraint is that no 0 or 1 be isolated either horizontally or vertically.

11. The apparatus of claim 1, wherein the predefined constraint is that every 0 belongs to a 2-by-2 square of 0's and every 1 belongs to a 2-by-2 square of 1's.

12. The apparatus of claim 11, wherein the group of bits is two bits in length.

13. The apparatus of claim 12, wherein the two-dimensional array is two bits high and three bits long.

14. A method of encoding a one-dimensional data stream into a two-dimensional data block for recording on a two dimensional recording device, comprising the steps of:

receiving a data stream;

partitioning the received data stream into a plurality of groups of bits;

encoding each group of bits into a two dimensional data array according to a predefined constraint wherein the predefined constraint enforces low-pass filtering; and assembling a plurality of two-dimensional data arrays into a two-dimensional data block.

15. The method of claim 14, wherein the partitioning step comprises the steps of:

partitioning the received data stream into a plurality of chunks of data; and partitioning each chunk of data into a plurality of groups of bits.

16. The method of claim 14, wherein the assembly step comprises the steps of:

concatenating a plurality of two-dimensional data arrays into a data strip; and assembling a plurality of data strips into a two-dimensional data block.

17. The method of claim 14, wherein:

the partitioning step comprises the steps of:

partitioning the received data stream into a plurality of chunks of data, and partitioning each chunk of data into a plurality of groups of bits; and the assembly step comprises the steps of:
concatenating a plurality of two-dimensional data arrays into a data strip, and
assembling a plurality of data strips into a two-dimensional data block.

18. The method of claim 14, wherein the predefined constraint is that no 0 is completely surrounded by 1's and that no 1 is completely surrounded by 0's.

19. The apparatus of claim 1, wherein the predefined constraint is that fewer than four of the nearest neighbors to a 0 are 1's and that fewer than four of the nearest neighbors to a 1 are 0's.

20. The method of claim 19, wherein the group of bits is three bits in length.

21. The method of claim 20, wherein the two-dimensional array is two bits high and two bits long.

22. The method of claim 14, wherein the predefined constraint is that fewer than three of the four nearest neighbors to a 0 are 1's and that fewer than three of the four nearest neighbors to a 1 are 0's.

23. The method of claim 14, wherein the predefined constraint is that no 0 or 1 be isolated either horizontally or vertically.

24. The method of claim 14, wherein the predefined constraint is that every 0 belongs to a 2-by-2 square of 0's and every 1 belongs to a 2-by-2 square of 1's.

25. The method of claim 24, wherein the group of bits is two bits in length.

26. The method of claim 25, wherein the two-dimensional array is two bits high and three bits long.

27. An apparatus for decoding a two-dimensional data block recorded on a two dimensional recording device into a one-dimensional data stream, comprising:

a receiver, receiving a two-dimensional data block comprising a plurality of data arrays, each data array encoded according to a predefined constraint;

a partitioning device, coupled to the receiver, partitioning the received two-dimensional data block into the plurality of data arrays;

an decoder, coupled to the partitioning device, decoding each data array into a plurality of groups of bits, wherein the predefined constraint enforces low-pass filtering; and a data block assembly device, coupled to the decoder, assembling a plurality of groups of bits into a one-dimensional data stream.

28. The apparatus of claim 27, wherein the data block assembly device comprises:

a first assembly device, coupled to the receiver, assembling a plurality of groups of bits into a chunk of data; and a second assembly device, coupled to the first assembly device, assembling a plurality of chunks of data into a one-dimensional data stream.

29. The apparatus of claim 27, wherein the predefined constraint is that no 0 is completely surrounded by 1's and that no 1 is completely surrounded by 0's.

30. The apparatus of claim 27, wherein the predefined constraint is that fewer than four of the nearest neighbors to a 0 are 1's and that fewer than four of the nearest neighbors to a 1 are 0's.

31. The apparatus of claim 30, wherein the group of bits is three bits in length.

32. The apparatus of claim 31, wherein the two-dimensional array is two bits high and two bits long.

33. The apparatus of claim 27, wherein the predefined constraint is that fewer than three of the four nearest neighbors to a 0 are all 1's and that fewer than three of the four nearest neighbors to a 1 are all 0's.

34. The apparatus of claim 27, wherein the predefined constraint is that no 0 or 1 be isolated either horizontally or vertically.

35. The apparatus of claim 27, wherein the predefined constraint is that every 0 belongs to a 2-by-2 square of 0's and every 1 belongs to a 2-by-2 square of 1's.

36. The apparatus of claim 35, wherein the group of bits is two bits in length.

37. The apparatus of claim 36, wherein the two-dimensional array is two bits high and three bits long.

38. A method of decoding a two-dimensional data block recorded on a two dimensional recording device into a one-dimensional data stream, comprising:

receiving a two-dimensional data block comprising a plurality of data arrays, each data array encoded according to a predefined constraint, wherein the predefined constraint enforces low-pass filtering;

partitioning the received two-dimensional data block into the plurality of data allays;

decoding each data array into a plurality of groups of bits; and assembling a plurality of groups of bits into a one-dimensional data stream.

39. The method of claim 38, wherein the data block assembly step comprises the steps of:

assembling a plurality of groups of bits into a chunk of data; and assembling a plurality of chunks of data into a one-dimensional data stream.

40. The method of claim 38, wherein the predefined constraint is that no 0 is completely surrounded by 1's and that no 1 is completely surrounded by 0's.

41. The method of claim 38, wherein the predefined constraint is that fewer than four of the nearest neighbors to a 0 are 1's and that fewer than four of the nearest neighbors to a 1 are 0's.

42. The method of claim 41, wherein the group of bits is three bits in length.

43. The method of claim 42, wherein the two-dimensional array is two bits high and two bits long.

44. The method of claim 38, wherein the predefined constraint is that fewer than three of the four nearest neighbors to a 0 are all 1's and that fewer than three of the four nearest neighbors to a 1 are all 0's.

45. The method of claim 38, wherein the predefined constraint is that no 0 or 1 be isolated either horizontally or vertically.

46. The method of claim 38, wherein the predefined constraint is that every 0 belongs to a 2-by-2 square of 0's and every 1 belongs to a 2-by-2 square of 1's.

47. The method of claim 46, wherein the group of bits is two bits in length.

48. The method of claim 47, wherein the two-dimensional array is two bits high and three bits long.

* * * * *